US005501940A

United States Patent [19]

Bloom et al.

[11] Patent Number: 5,501,940

[45] Date of Patent: Mar. 26, 1996

[54] PROCESS FOR PROTECTING A BINARY IMAGE WITH A SILOXANE DURABLE LAYER THAT IS NOT REMOVABLE BY HEXANE, ISOPROPANOL OR WATER

[75] Inventors: Iris B. K. Bloom, Waltham; Agota F. Fehervari, Lexington, both of Mass.; Russell A. Gaudiana, Merrimack, N.H.; Richard A. Minns, Arlington; Howard G. Schild, Brighton, both of Mass.

[73] Assignee: Polaroid Corporation, Cambridge, Mass.

[21] Appl. No.: 65,345

[22] Filed: May 20, 1993

[51] Int. Cl.[6] .................... G03F 7/34

[52] U.S. Cl. .................... 430/253; 430/254; 430/256; 430/259; 430/272; 430/273

[58] Field of Search .................... 430/253, 256, 430/259, 271, 272, 273, 254

[56] References Cited

U.S. PATENT DOCUMENTS

| | | | |
|---|---|---|---|
| 4,004,927 | 1/1977 | Yamamoto et al. . | |
| 4,077,830 | 3/1978 | Fulwiler | 156/249 |
| 4,329,420 | 5/1982 | Bopp | 430/293 |
| 4,472,491 | 9/1984 | Wiedemann | 430/58 |
| 4,508,811 | 4/1985 | Gravesteijn et al. | 430/270 |
| 4,522,881 | 6/1985 | Kobayashi et al. | 428/336 |
| 4,623,614 | 11/1986 | Yoneyama et al. | 430/523 |
| 4,719,169 | 1/1988 | Platzer et al. | 430/258 |
| 4,741,992 | 5/1988 | Przezdziecki | 430/523 |
| 4,902,594 | 2/1990 | Platzer | 430/14 |
| 4,914,012 | 4/1990 | Kawai | 430/536 |
| 4,921,776 | 5/1990 | Taylor, Jr. | 430/293 |
| 5,170,261 | 12/1992 | Cargill et al. | 358/298 |
| 5,200,297 | 4/1993 | Kelly | 430/253 |
| 5,258,247 | 11/1993 | Platzer | 430/143 |

FOREIGN PATENT DOCUMENTS

| | | |
|---|---|---|
| 348310 | 12/1989 | European Pat. Off. . |
| 516985 | 12/1992 | European Pat. Off. . |
| WO88/04237 | 6/1988 | WIPO . |
| WO92/09930 | 6/1992 | WIPO . |
| WO92/09661 | 6/1992 | WIPO . |
| WO92/10057 | 6/1992 | WIPO . |

OTHER PUBLICATIONS

Macbride, Up, up and away for transfer decoration, Modern Plastics, Nov. 1984, pp. 54–56.

Maggi, Making heat transfers with coating machinery, Plastics Engineering, Mar. 1984, pp. 61–65.

Mayer, Stop—A New Contrast Amplifying Xerographic Process, pp. 157–160.

*Primary Examiner*—Charles L. Bowers, Jr.
*Assistant Examiner*—Christopher G. Young
*Attorney, Agent, or Firm*—David J. Cole

[57] ABSTRACT

A binary image comprising a plurality of first areas, at which a porous or particulate image-forming substance is adhered to a substrate, and a plurality of second areas, at which the substrate is free from the image-forming substance, is protected by laminating thereto a laminating sheet comprising a durable layer and a support layer with the durable layer facing the image, so that the durable layer adheres to both the first and second areas of the image. The support layer is then displaced away from the image such that the durable layer remains attached to the image. The durable layer is substantially transparent and comprises a polymeric organic material having incorporated therein a siloxane, the siloxane being incorporated into the polymeric material in such a manner that it is not removed therefrom by hexane, isopropanol or water.

22 Claims, 4 Drawing Sheets

PROCESS FOR PROTECTING A BINARY IMAGE WITH A SILOXANE DURABLE LAYER THAT IS NOT REMOVABLE BY HEXANE, ISOPROPANOL OR WATER

BACKGROUND OF THE INVENTION

This invention relates to a protected image and a process for the production of such an image.

International Patent Application No. PCT/US87/03249 (Publication No. WO 88/04237), the disclosure of which is incorporated herein by reference, describes a thermal imaging medium and a process for forming an image in which a layer of a porous or particulate image-forming substance (preferably, a layer of carbon black) is deposited on a heat-activatable image-forming surface of a first sheet-like or web material (hereinafter the "first sheet element"), the layer having a cohesive strength greater than its adhesive strength to the first sheet-like element. Portions of this thermal imaging medium are then exposed to brief and intense radiation (for example, by laser scanning), to firmly attach exposed portions of the image-forming substance to the first sheet element. Finally, those portions of the image-forming substance not exposed to the radiation (and thus not firmly attached to the first sheet element) are removed, thus forming a binary image comprising a plurality of first areas where the image-forming substance is adhered to the first sheet-like element and a plurality of second areas where the first sheet-like element is free from the image-forming substance. Hereinafter, this type of image will be called a "differential adhesion" image.

In a preferred embodiment of the imaging medium described in the aforementioned International Application, the image-forming substance is covered with a second laminated sheet-like element so that the image-forming substance is confined between the first element and this second element. After imaging and separation of the unexposed portions of the image-forming substance (with the second element) from the first element, a pair of images is obtained.

A first image comprises exposed portions of image-forming substance more firmly attached to the first element by heat activation of the heat-activatable image-forming surface. A second image comprises non-exposed portions of the image-forming substance carried or transferred to the second sheet element.

The respective images obtained by separating the sheets of an exposed thermal imaging medium having an image-forming substance confined therebetween may exhibit substantially different characteristics. Apart from the imagewise complementary nature of these images and the relation that each may bear as a "positive" or "negative" of an original, the respective images may differ in character. Differences may depend upon the properties of the image-forming substance, on the presence of additional layer(s) in the medium, and upon the manner in which such layers fail adhesively or cohesively upon separation of the sheets. Either of the pair of images may, for reasons of informational content, aesthetics or otherwise, be desirably considered the principal image, and all of the following discussion is applicable to both types of image.

The image-forming process described in the aforementioned International Application can produce high quality, high resolution images. However, the images produced by this process may suffer from low durability because, in the finished image, the porous or particulate image-forming substance, which is typically carbon black admixed with a binder, lies exposed on the surface of the image, and may be smeared, damaged or removed by, for example, fingers or other skin surfaces (especially if moist), solvents or friction during manual or other handling of the image.

It is known to protect various types of images by laminating transparent films over the image. For example, U.S. Pat. No. 4,921,776 describes a method of providing a lower gloss protective covering for a pre-press color proof. This method comprises laminating to the image surface a thin, substantially transparent integral polymeric film consisting essentially of a mixture of at least two slightly incompatible polymers, whereby the film exhibits a 20° specular gloss that is at least 5% lower than the gloss of a film prepared from any one of the polymer constituents.

U.S. Pat. No. 4,902,594 describes a photoimaged article having a protected image composed of a colored image on a support, and a thin, transparent, flexible, non-self supporting, protective layer on the surface of the image. The layer is substantially non-tacky at room temperature, and has at least a major amount based on the weight of the layer of one or more thermoplastic resins of a vinyl acetal, vinyl chloride, or acrylic polymer or copolymer having a $T_g$ of from about 35° C. to about 110° C. The layer is capable of being adhesively transferred directly to the image when the layer is first applied on the release surface of a temporary support, and the image and protective layer are laminated together under pressure at temperatures of between about 60° C. to about 180° C. with subsequent removal of the temporary support.

U.S. Pat. No. 4,719,169 issued Jan. 12, 1988 describes a method for protecting an image. This method comprises providing a colored image on a substrate and either:

a. applying an antiblocking layer to a release surface of a temporary support; bonding a thermoplastic adhesive layer to the antiblocking layer; laminating the applied support to the colored image via the adhesive; and peeling away the temporary support from the antiblocking layer; or b. applying a thermoplastic adhesive layer to a release surface of a first temporary support; applying an antiblocking layer onto a release surface of a second temporary support, laminating the adhesive onto the colored image and peeling away the first temporary support; and laminating the antiblocking layer onto the adhesive layer and peeling away the second temporary support;

wherein the adhesive layer is substantially non-tacky at room temperature, is laminated at temperatures of about 60° C. to 90° C., and comprises one or more thermoplastic polymers or copolymers; and the antiblocking layer comprises one or more organic polymers or copolymers, which layer does not cohesively block at about 50° C. or less. The intended use of this invention is to protect color proofs used in the graphic arts industry.

The protection of an image produced by the process described in the aforementioned International Application presents peculiar difficulties. A differential adhesion image has a microstructural or topographical character, with areas of the image-forming substance protruding above the sheet element to which it is attached (hereinafter called the "substrate"), and the surface characteristics of the image-forming substance are typically very different from those of the substrate. (If the imaging medium contains a release layer, as described in the aforementioned International Application, in some cases the areas of the image, which are not covered by image-forming substance, may have a surface formed of the release layer. Typically, the surface characteristics of this release layer are very different from those of a carbon black image-forming substance.) Furthermore, the porous or particulate image-forming substance used is typically more friable than, for example, printing ink, and thus more susceptible to abrasion, smearing and other deformation.

International Application No. PCT/US91/08345 (published as WO 92/09930 on Jun. 11, 1992) describes a process for protecting a binary image, such as that produced by the aforementioned International Application No. PCT/US87/03249, having a plurality of first areas, at which a porous or particulate image-forming substance is adhered to a substrate, and a plurality of second areas, at which the substrate is free from the image-forming substance. This protecting process is carried out by laminating to the image a laminating sheet comprising a durable layer and a support layer, with the durable layer facing the image, so that the durable layer adheres to both the first and second areas of the image. The support layer is then displaced away from the image such that the image remains covered with a durable layer which:

a) is substantially transparent;

b) has an abrasion resistance of at least 10 cycles of a 10 Newton force as measured by an Erichsen Scar Resistance Tester (referred to as an Erikson Abrasion Meter in the International Application No. PCT/US91/08345) and a critical load value of at least 100 grams as measured by ANSI PH1.37-1983; and c) is not removed from the image by contact with adhesive tape having an adhesion to steel of 33 grams per millimeter as measured by ASTM D-3330. The preferred durable layers for use in this process are acrylic polymers, and the process provides the binary images with protection adequate for many fields in which such images are used.

However, binary images having the specific durable layers mentioned in the International Application No. PCT/US91/08345 are not entirely satisfactory for use as copying media in the graphic arts industry. In this industry, it is common practice to position images securely in layouts with a strong adhesive tape (hereinafter called "graphic arts tape", and also referred to in the industry as "ruby tape"; one major brand is sold commercially as "Red Lithographers tape #616" by Minnesota Mining and Manufacturing Corporation, St. Paul, Minn., 55144- 1000), and it is frequently necessary to secure an image with such tape and later to peel the tape from the image, and then to repeat this process several times. Also, in this industry images are subject to multiple washings with isopropanol and other solvents to ensure the high degree of cleanliness needed in images used for further copying. It has been found that under the extreme stresses caused by such repeated applications of graphic arts tape and repeated washings, the durable layers mentioned in the International Application No. PCT/US91/08345 may not adhere adequately to the underlying image. Accordingly, there is a need for protection of such binary images in a manner which renders the protected image durable, transparent and abrasion-resistant, and permits repeated applications of graphic arts tape, and repeated solvent washings of the protected image, without risk of separation of the durable layer from the binary image. This invention provides a process for such protection of binary images.

SUMMARY OF THE INVENTION

This invention provides a process for protecting a binary image, this binary image comprising a plurality of first areas, at which a porous or particulate image-forming substance is adhered to a substrate, and a plurality of second areas, at which the substrate is free from the image-forming substance, which process comprises:

providing a laminating sheet comprising a durable layer and a support layer, the durable layer being substantially transparent and comprising a polymeric organic material having incorporated therein a siloxane, the siloxane being incorporated into the polymeric material in such a manner that it is not removed therefrom by hexane, isopropanol or water;

laminating the laminating sheet to the binary image so that the durable layer adheres to both the first and second areas of the image; and separating the support layer from the image such that the durable layer remains attached to the image, thereby covering the image with a durable layer such that exposure of the durable layer to hexane, isopropanol or water does not remove the siloxane from the durable layer.

This invention also provides a first process for forming a protected image, this process comprising:

providing a layer of a porous or particulate image-forming substance on a heat-activatable image-forming surface of a substrate, the layer of the image-forming substance having a cohesive strength greater than the adhesive strength between the layer and the substrate, thereby providing a thermal imaging medium;

imagewise subjecting portions of the thermal imaging medium to exposure to brief and intense radiation, thereby firmly attaching exposed portions of the image-forming substance to the substrate;

removing from the substrate those portions of the image-forming substance not exposed to the radiation, thereby forming a binary image comprising a plurality of first areas, at which the image-forming substance is adhered to a substrate, and a plurality of second areas, at which the substrate is free from the image-forming substance; and thereafter protecting the resultant binary image by the process of the present invention.

This invention also provides a second process for forming a protected image, this process comprising:

providing a layer of a porous or particulate image-forming substance on a heat-activatable image-forming surface of a first sheet-like element, the layer of the image-forming substance having a cohesive strength greater than the adhesive strength between the layer and the first element;

providing a second sheet-like element on the opposed side of the layer of image-forming substance from the first element, the image-forming substance having an adhesion to the second element greater than its adhesion to the first element, thereby providing a thermal imaging medium;

imagewise subjecting portions of the thermal imaging medium to exposure to brief and intense radiation, thereby firmly attaching exposed portions of the image-forming substance to the first element;

separating the first and second elements, thereby leaving those portions of the image-forming substance not exposed to the radiation attached to the second element and those portions of the image-forming substance exposed to the radiation attached to the first element, and thereby forming a pair of images on the first and second elements, each of the images comprising a plurality of first areas, at which the image-forming substance is adhered to the first or second element, and a plurality of second areas, at which the first or second element is free from the image-forming substance; and thereafter protecting the resultant binary image by the process of the present invention.

Finally, this invention provides a protected binary image, the image comprising a plurality of first areas at which a porous or particulate image-forming substance is adhered to a substrate and a plurality of second areas at which the substrate is free from the image-forming substance, and a durable layer covering the image and adhered to both the first and second areas thereof, the durable layer being substantially transparent and comprising a polymeric organic material having incorporated therein a siloxane, the siloxane being incorporated into the polymeric material in such a manner that it is not removed therefrom by hexane, isopropanol or water.

DETAILED DESCRIPTION OF THE INVENTION

Figure 1:
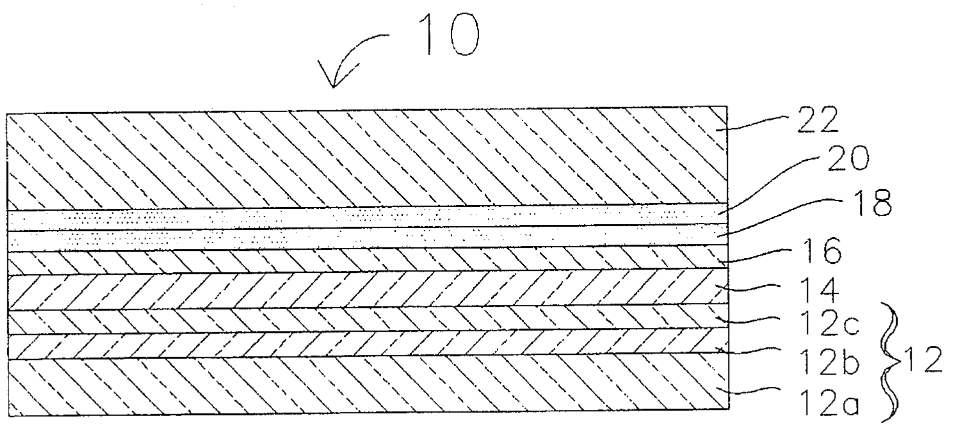
FIG. 1 of the accompanying drawings shows in section a thermal imaging medium of the type described in the aforementioned International Application.

In the present process, the binary image is covered with a durable layer which is substantially transparent and comprises a polymeric material having a siloxane incorporated therein, the siloxane being incorporated into the polymeric material in such a manner that it is not removed therefrom by hexane, isopropanol or water. Incorporation of the siloxane into the durable layer, it has been found, enables graphic arts tapes to be adhered to and peeled from the durable layer without disturbing the adhesion of the durable layer to the underlying image, or of the image to the substrate. Preferred embodiments of the present invention allow repeated application and removal of graphic arts tape before or after exposure of the protected image to water, hexane, isopropanol and commercial graphic arts film cleaners which contain non-polar solvents.

The advantages provided by the incorporation of a siloxane into the durable layer have been found not to be explicable simply on the basis of inclusion of a material capable of providing a low surface energy durable layer. For example, the present inventors have tested durable layers formed from copolymers containing various fluorinated monomers and found that such fluorinated copolymers do not provide sufficient resistance to repeated application of tape to the protected image. Moreover, the advantages of the present invention are not achieved simply by admixing a siloxane monomer, oligomer or surfactant into a durable homopolymer and using the resultant mixture as the durable layer, since repeated washing of the durable layer with isopropanol or other solvents extracts the siloxane from the durable layer, thus adversely affecting the properties of the durable layer, particularly its ability to withstand repeated application and peeling of graphic arts tape.

Incorporation of the siloxane into the durable layer so that the siloxane is not removed by water, hexane or isopropanol can be effected in various ways. For example, the durable layer may be formed by providing a mixture of an organic polymer, a polymerizable monomer or oligomer of a siloxane, and a polymerization initiator, and subjecting this mixture to conditions effective to activate the polymerization initiator, thereby causing polymerization of the siloxane monomer or oligomer, and formation of the polymeric organic material containing the siloxane. It is believed (although this invention is in no way limited by this belief) that this method of forming the polymeric organic material typically produces a semi-interpenetrating network with a network of polymerized siloxane extending through the network formed by the organic polymer. The polymerization initiator may be a thermal initiator (for example, a peroxide or 2,2'-azobis(2-methylpropionitrile) (usually known as AIBN)), which is activated by heating the layer of the mixture on the support layer, or the initiator may be a photoinitiator (for example 2,2-dimethoxy-2-phenylacetophenone, available as Irgacure 651 from Ciba-Geigy Corporation, 7 Skyline Drive, Hawthorne, N.Y. 10532-2188, which is activated by exposure to ultra-violet radiation). Desirably, in some cases, the mixture includes a cross-linking agent; preferred cross-linking agents for use with the preferred siloxanes discussed below are pentaerythritol triacrylate (PETA) and trimethylol-propane triacrylate (TMPTA).

Alternatively, the organic polymeric material may be a graft copolymer of a siloxane and an organic monomer. Techniques for preparing such graft copolymers in solution are well known to those skilled in the art of polymer synthesis. Examples 5 and 6 below illustrate a specialized technique for synthesis of such graft copolymers in aqueous media; in this technique, a siloxane oligomer having one ethylenically-unsaturated end group is copolymerized with an ethylenically-unsaturated organic monomer to form a graft copolymer having siloxane side-chains.

Another preferred siloxane-containing polymeric organic material for use in the present process is prepared by copolymerizing a siloxane monomer or oligomer with an organic monomer or oligomer which has been functionalized with vinyl ether groups. A variety of such vinyl ether functionalized monomers and oligomers are available commercially including, for example, VEctomer 2010, a vinyl ether functionalized aromatic urethane oligomer and VEctomer 4010, a divinyl ether functionalized aromatic ester monomer, both sold by Allied Signal Corporation, Morristown, N.J. 07962, and Rapi-Cure (Registered Trade Mark) CHVE, a divinyl ether functionalized cyclohexane, sold by GAF Corporation, Wayne, N.J. 07470. Typically, the mixture of the functionalized monomer or oligomer and the siloxane is polymerized by adding a sensitizer, for example a sulfonium salt, and exposing the mixture to ultra-violet radiation.

The organic material in the durable layer is desirably derived from a monomer which forms a homopolymer of which is sufficiently transparent and durable for the use to be made of the protected image. When the durable layer is to be prepared by polymerizing the siloxane in the presence of a pre-existing organic polymer, the organic material must, of course, be sufficiently compatible with the siloxane that polymerization of the siloxane can be effected in the presence of the organic material without significant phase separation. Preferably, the organic material is a polyacrylate or polymethacrylate (for example poly(methyl methacrylate)), polystyrene or a polyurethane.

Similarly, when the durable layer is to be prepared by polymerizing the siloxane in the presence of a pre-existing organic polymer, the siloxane used in the present process must be sufficiently compatible with the organic material so that polymerization of the siloxane can be effected without significant phase separation, which would adversely affect the transparency of the durable layer and its ability to withstand repeated applications of solvents without change in properties. The suitability of any specific siloxane for use in the present process can be determined by routine empirical tests. If the durable layer is to be formed by polymerizing the siloxane in the presence of a pre-existing organic polymer, the siloxane preferably has a functionality of at least about two, and desirably comprises an acrylate or methacrylate group. However, when the durable layer is prepared by graft polymerization or using a vinyl ether functionalized organic monomer or oligomer, monofunctional siloxanes may be employed. Specific siloxanes which have been found useful in the present processes are that sold as Petrarch PS 802 by Hüls America, Piscataway, N.J. (according to the manufacturer, this material is a copolymer of dimethyl siloxane with 15–20 weight percent of (acryloxypropyl)methyl siloxane), and those sold as Ebecryl 350 and 1360 by UCB Radcure, Inc., 2000 Lake Park Drive, Smyrna Ga. 30080 (according to the manufacturer, the latter is a silicone hexaacrylate).

The optimum portion of siloxane in the durable layer is best determined empirically. Although larger proportions of siloxane may sometimes be desirable, typically, good results can be obtained using not more than about 10 percent by weight of siloxane in the durable layer, and in many cases not more than about 5 weight percent. Especially when the durable layer is formed by polymerizing the siloxane in the presence of a pre-formed organic polymer, inclusion of excess siloxane may reduce the durability of the durable layer by lowering the glass transition temperature of the cured polymeric durable layer, and may allow phase separation of the organic material/siloxane mixture before or after curing.

In general, it is preferred that the durable layer on the image not have a thickness greater than about 30 μm, since thicker durable layers may sometimes cause optical problems in viewing the image due to internal reflections and/or refraction effects within the durable layer, and the thicker the durable layer the more light it absorbs. Also, when a protected image is used to expose a radiation-sensitive material, the durable layer is placed in contact with the radiation-sensitive material. Consequently, the thickness of the durable layer affects the resolution achievable in the final image in the radiation-sensitive material. To prevent undesirable loss of resolution, it is in general desirable that the durable coating formed have a thickness not greater than about 10 μm, and preferably in the range of from about 0.5 to about 6 μm, since durable layers of these thicknesses normally do not cause optical problems in viewing the image, and permit exposure of radiation-sensitive materials through the protected image without adversely affecting the resolution of the image produced. To produce such a thin durable layer smooth enough to prevent undesirable optical effects when the protected image is used to expose a radiation-sensitive material, it is convenient to form the durable layer in situ by forming the necessary polymerizable mixture, spreading a layer of this mixture upon the support layer, and subjecting the layer of the mixture to conditions effective to cause polymerization to form the final durable layer, provided of course that the polymerization technique used is one which can be practiced under these conditions.

As noted in the International Application No. PCT/US91/08345, a differential adhesion image typically extends close to the periphery of the substrate, since for practical reasons it is desirable to coat the various layers of the differential adhesion imaging medium, including the porous or particulate image-forming substance, on large webs and then to divide these webs into the smaller sheets required for individual images. To protect a differential adhesion image extending close to the periphery of the substrate, it is necessary that the durable layer also extend to this periphery; on the other hand, both for aesthetic reasons and for ease of handling, surplus durable layer should not extend beyond the periphery of the substrate, and the process for applying the protective layer should not require elaborate procedures for registering the durable layer with the image. Accordingly, in a preferred form of the present process, the laminating sheet is laminated to the binary image such that at least one portion of the laminating sheet extends beyond the periphery of the substrate, and the support layer is separated from the image such that, in this portion or portions of the laminating sheet, the durable layer remains attached to the support layer so that the durable layer breaks substantially along the periphery of the substrate.

The support layer of the laminating sheet may be formed from any material which can withstand the conditions which are required to laminate the laminating sheet to the image and which is sufficiently coherent and adherent to the durable layer to permit displacement of the support layer away from the image after lamination, with removal of those portions of the durable layer which extend beyond the periphery of the substrate. Typically, the support layer is a plastic film, and polyester (preferably poly(ethylene terephthalate)) films are preferred. A film with a thickness in the range of about 0.5 to about 2 mil (13 to 51 μm) has been found satisfactory. If desired, the support layer may be treated with a subcoat or other surface treatment, such as will be well known to those skilled in the coating art, to control its surface characteristics, for example to increase or decrease the adhesion of the durable layer or other layers (see below) to the support layer.

The laminating sheet may comprise additional layers besides the durable layer and support layer. For example, the laminating sheet may comprise a release layer interposed between the durable layer and the support layer, this release layer being such that, in the areas where the durable layer remains attached to the image, separation of the durable layer from the support layer occurs by failure within or on one surface of the release layer. The release layer is preferably formed from a wax, or from a silicone. As will be apparent to those skilled in the art, in some cases part or all of the release layer may remain on the surface of the durable coating after the support layer has been removed, and if a radiation-sensitive material is to be exposed through the protected image, care must of course be taken to ensure that any remaining release layer on the protected image does not interfere with such exposure.

The laminating sheet may also comprise an adhesive layer disposed on the surface of the durable layer remote from the support layer so that, during the lamination, the durable layer is adhered to the image by the adhesive layer. In general, the use of an adhesive layer is desirable to achieve strong adhesion between the durable layer and the image, and/or to lower the temperature needed for lamination. Various differing types of adhesive may be used to form the adhesive layer; for example, the adhesive layer might be formed from a thermoplastic (hot melt) adhesive and the lamination is effected by heating the adhesive layer above its glass transition temperature. A preferred hot melt adhesive for this purpose is an ethylene/vinyl acetate copolymer, for example that sold as Morton X95-110 by Morton Adhesives and Specialty Polymers, 1275 Lake Avenue, Woodstock, Ill. 60098; this product contains a mixture of two ethylene/vinyl acetate copolymers, two tackifiers and a wax. Alternatively, the adhesive may be an ultraviolet curable adhesive (in which case the lamination is performed with the uncured adhesive, after which the adhesive is exposed to ultraviolet radiation, so curing the adhesive layer), or a pressure sensitive adhesive, typically one having an adhesion to steel of about 22 to about 190 grams per millimeter (in which case the lamination is effected simply by pressure).

The durable layer formed on the image should adhere sufficiently to the image that it is not removed therefrom by repeated contact with graphic arts tape before or after application of solvents used in the graphics art industry for cleaning films. Desirably the durable layer provided on the image by the present processes has an abrasion resistance of at least 10 cycles of a 10 Newton force as measured by an Erichsen Scar Resistance Tester; and is not removed from the image by adhesive tape having an adhesion to steel of 33 grams per millimeter, as measured by ASTM D-3330.

If the present process is to be used to produce a protected image intended to be viewed in reflection, the substrate of the image may be opaque, and may be formed from paper or a similar material. However, typically the substrate of the image will be essentially transparent, and the substrate is a plastic web having a thickness of from about 1 to about 1000 μm, and preferably about 25 to about 250 μm. As is well known to those skilled in the imaging art, the substrate may carry one or more sub-coats or be subjected to surface treatment to improve the adhesion of the image-forming substance to the substrate. Materials suitable for use as the substrate include polystyrene, polyester, polyethylene, polypropylene, copolymers of styrene and acrylonitrile, poly(vinyl chloride), polycarbonate and poly(vinylidene chloride). An especially preferred web material from the standpoints of durability, dimensional stability and handling characteristics is poly(ethylene terephthalate), commercially available, for example, under the tradename Mylar, of E. I. du Pont de Nemours & Co., Wilmington, Del., or under the tradename Kodel, of Eastman Kodak Company, Rochester, N.Y.

The image-forming substance typically comprises a porous or particulate colorant material admixed with a binder, the preferred colorant material being carbon black, although other optically dense colorants, for example graphite, phthalocyanine pigments and other colored pigments may be used. The binder may be, for example, gelatin, poly(vinyl alcohol), hydroxyethylcellulose, gum arabic, methylcellulose, polyvinylpyrrolidone or polyethyloxazoline.

The images protected by the process of the present invention may be of various types. For example, the present process could be used for protecting radiographs, CAT scans, ultrasonograms and similar medical images. Often, the medical personnel using such images will need to view them on conventional lightboxes, to which the images will be fixed with heavy metal clips. Accordingly, in this application it is important that the durable layer withstand repeated affixation to a lightbox by means of such clips.

However, as already mentioned, the present invention is primarily intended for use in the graphics arts industry in the production of films (including separation, imagesetter, contact, duplicating, camera and other films) and of pre-press proofs. In the printing industry, it is conventional practice to form images of originals on separation imaging film (a single image for monochrome printing, or a series of color separations for color printing) and then to prepare a printing plate, or additional intermediate films or proofs, by contact exposing a radiation-sensitive material through the separation imaging film.

Conventional practices in the printing industry make stringent demands upon separation film images. The image must, of course, have high optical clarity so that exposure of a printing plate can be effected through the image. The need for exposure of the radiation-sensitive material through the film also requires that the thickness of the layers in the film be limited. The separation film image must have good abrasion resistance against general handing and cleaning so that it can withstand being pressed against the radiation-sensitive material, removed therefrom, stored for an extended period and then reused for making another printing plate, or additional intermediate films or proofs. The separation film image must also have non-blocking properties.

When the protected image of the present invention is to be used for exposing a radiation-sensitive material, the durable coating over the image must transmit the radiation used to expose the radiation-sensitive material; in particular, in many commercial applications, the substrate should transmit ultraviolet and visible radiation in the wavelength range of about 300 to about 460 nm.

When a protected image is used to expose a radiation-sensitive material, the durable layer is normally placed in contact with the radiation-sensitive material. Consequently, the thickness of the durable layer affects the resolution achievable in the final image in the radiation-sensitive material. As already mentioned, to prevent undesirable loss of resolution, it is in general desirable that the durable coating formed have a thickness not greater than about 30 μm, desirably not greater than about 12 μm, and preferably in the range of from about 0.5 to about 10 μm, since durable layers of these thicknesses normally do not cause optical problems in viewing the image, and permit exposure of radiation-sensitive materials through the protected image without adversely affecting the resolution of the image produced. It should be noted that some plastics normally regarded as durable when in thick layers are insufficiently durable in 2 to 6 μm layers, and acrylic polymers, for example poly(methyl methacrylate), polystyrenes and polyurethanes are the preferred materials for forming the durable layer.

To allow the protected image to be exposed using the vacuum frames conventional in the printing industry, desirably the durable layer provides a durable coating which can sustain a vacuum drawdown of 660 mm Hg for five minutes without the appearance of Newton's rings. It is also desirable that the durable coating produced survive intimate contact by vacuum drawdown for five minutes with other films and plates without blocking or other damage to the film or protected image.

To avoid air being trapped between the protected image and the radiation-sensitive material, it is desirable that the durable coating produced have a matte, slightly roughened surface, since such a matte surface allows for escape of air from between the durable coating and the radiation-sensitive material with which it is in contact, thus preventing the formation of Newton's rings and other undesirable interference phenomena caused by trapped air. It has been found that the texture of the surface of the support layer in contact with the durable layer affects the texture of the durable coating produced, and accordingly it is desirable that this surface be matte.

In the production of printing plates, it is highly desirable that the operator be able to distinguish visually between the two sides of the protected image in order to avoid accidental inversion of the protected image, with consequent lateral inversion of the image formed on the printing plate. Accordingly, it is preferred that the durable layer formed on the image have a gloss number in the range of from about 50 to about 100 at a 60° angle, desirably about 60 to about 80 at this angle. A similar gloss number is desirable for protected medical images to avoid images being stored with their imaging layers in contact, and to prevent unfortunate accidents caused by accidental lateral inversion of the image of a patient being treated.

Figure 2:
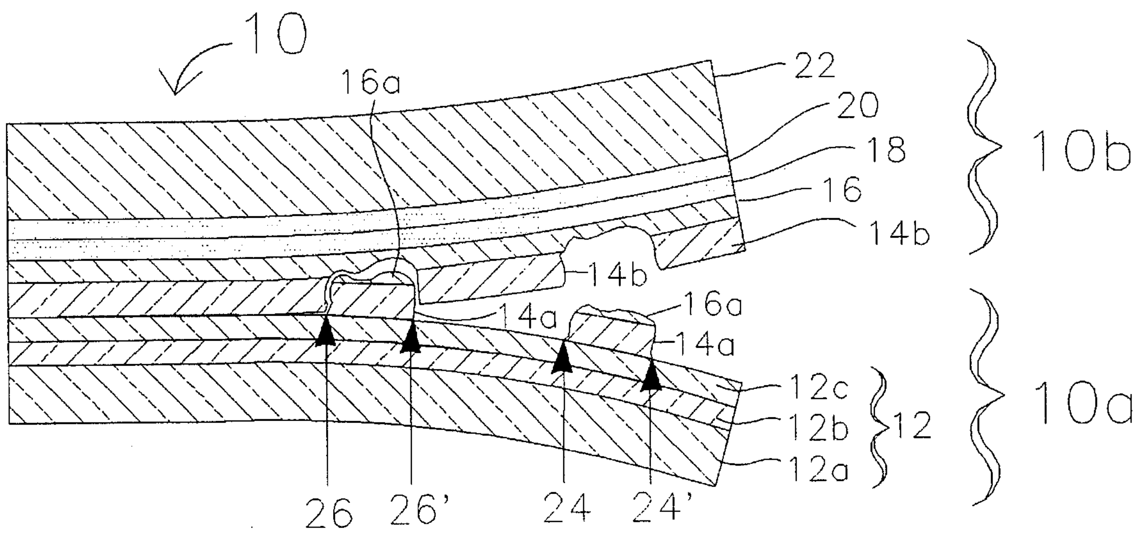
FIG. 2 shows a section, similar to that of FIG. 1 through the medium as the first and second elements thereof are being separated to form a pair of complementary-binary images.

In FIG. 1, there is shown a preferred laminar imaging medium (generally designated 10) of the present invention suited to production of a pair of high resolution images, shown in FIG. 2 as images 10*a* and 10*b* in a partial state of separation. Thermal imaging medium 10 includes a first element in the form of a first sheet-like or web material 12 (comprising sheet material 12*a*, stress-absorbing layer 12*b* and heat-activatable zone or layer 12*c*) having superposed thereon, and in order, porous or particulate image-forming layer 14, release layer 16, first adhesive layer 18, second, hardenable polymeric adhesive layer 20 and second sheet-like or web material 22.

Upon exposure of the medium 10 to infra-red radiation, exposed portions of image-forming layer 14 are more firmly attached to web material 12, so that, upon separation of the respective sheet-like materials, as shown in FIG. 2, a pair of images, 10*a* and 10*b*, is provided. The nature of certain of the layers of preferred thermal imaging medium material 10 and their properties are importantly related to the manner in which the respective images are formed and partitioned from the medium after exposure. The various layers of medium material 10 are described in detail below.

Web material 12 comprises a transparent material through which imaging medium 10 can be exposed to radiation. Web material 12 can comprise any of a variety of sheet-like materials, although polymeric sheet materials will be especially preferred. Among preferred sheet materials are polystyrene, poly(ethylene terephthalate), polyethylene, polypropylene, poly(vinyl chloride), polycarbonate, poly(vinylidene chloride), cellulose acetate, cellulose acetate butyrate and copolymeric materials such as the copolymers of styrene, butadiene and acrylonitrile, including poly(styrene-co-acrylonitrile).

The stress-absorbing layer 12*b* is as described in U.S. Pat. No. 5,200,297 and the corresponding International Patent Application No. PCT/US91/08604 (Publication No. WO 92/09443), and comprises a polymeric layer capable of absorbing physical stresses applied to the imaging medium 10. The stress-absorbing layer 12*b* provides added protection against delamination of the medium 10 when rigorous physical stresses are applied thereto, and is desirably formed from a compressible or elongatable polyurethane. The stress-absorbing layer 12*b* is optional and may sometimes be omitted, depending upon the second adhesive layer 20 used and the stresses to which the medium 10 will be subjected.

Heat-activatable zone or layer 12*c* provides an essential function in the imaging of medium 10 and comprises a polymeric material which is heat activatable upon subjection of the medium to brief and intense radiation, so that, upon rapid cooling, exposed portions of the surface zone or layer 12*c* are firmly attached to porous or particulate image-forming layer 14. If desired, when the stress-absorbing layer 12*b* is omitted, surface zone 12*c* can be a surface portion or region of web material 12, in which case, layers 12*a* and 12*c* will be of the same or similar chemical composition. In general, it is preferred that layer 12*c* comprise a discrete polymeric surface layer on sheet material 12*a* or stress-absorbing layer 12*b*. Layer 12*c* desirably comprises a polymeric material having a softening temperature lower than that of sheet material 12*a*, so that exposed portions of image-forming layer 14 can be firmly attached to web material 12. A variety of polymeric materials can be used for this purpose, including polystyrene, poly(styrene-co-acrylonitrile), poly(vinyl butyrate), poly(methyl methacrylate), polyethylene and poly(vinyl chloride).

The employment of a thin heat-activatable layer 12*c* on a substantially. thicker and durable sheet material 12*a* permits desired handling of the web material and desired imaging efficiency. The use of a thin heat-activatable layer 12*c* concentrates heat energy at or near the interface between layers 12*c* and image-forming layer 14 and permits optimal imaging effects and reduced energy requirements. It will be appreciated that the sensitivity of layer 12*c* to heat activation (or softening) and attachment or adhesion to layer 14 will depend upon the nature and thermal characteristics of layer 12*c* and upon its thickness.

Stress-absorbing layer 12*b* can be provided on sheet material 12*a* by the methods described in the aforementioned U.S. Pat. No. 5,200,297 and International Patent Application No. PCT/US91/08604. Heat-activatable layer 12*c* can be provided by resort to known coating methods. For example, a layer of poly(styrene-co-acrylonitrile) can be applied to a web of poly(ethylene terephthalate) by coating from an organic solvent such as methylene chloride. The desired handling properties of web material 12 will be influenced mainly by the nature of sheet material 12*a* itself, since layers 12*b* and 12*c* will be coated thereon as thin layers. The thickness of web material 12 will depend upon the desired handling characteristics of medium 10 during manufacture, imaging and any post-imaging steps. Thickness will also be dictated in part by the intended use of the image to be carried thereon and by exposure conditions, such as the wavelength and power of the exposing source. Typically, web material 12 will vary in thickness from about 0.5 to 7 mil (about 13 to 178 μm). Good results are obtained using, for example, a sheet material 12*a* having a thickness of about 1.5 to 1.75 mils (38 to 44 μm). Stress-absorbing layer 12*b* will typically have a thickness in the range of about 1 to 4 μm, while layer 12*c* will typically be a layer of poly(styrene-co-acrylonitrile) having a thickness of about 0.1 to 5 μm.

Heat-activatable layer 12*c* can include additives or agents providing known beneficial properties. Adhesiveness-imparting agents, plasticizers, adhesion-reducing agents, or other agents can be used. Such agents can be used, for example, to control the adhesion between layers 12*c* and 14, so that undesirable separation at the interface is minimized during the manufacture of laminar medium 10 or its use in a thermal imaging method or apparatus. Such control also permits the medium, after imaging and separation of sheet-like web materials 12 and 22, to be partitioned in the manner shown in FIG. 2.

Image-forming layer 14 comprises an image-forming substance deposited onto heat-activatable zone or layer 12*c* as a porous or particulate layer or coating. Layer 14, also referred to as a colorant/binder layer, can be formed from a colorant material dispersed in a suitable binder, the colorant being a pigment or dye of any desired color, and preferably being substantially inert to the elevated temperatures required for thermal imaging of medium 10. Carbon black is a particularly advantageous and preferred pigment material. Preferably, the carbon black material will comprise particles having an average diameter of about 0.01 to 10 μm. Although the description herein will refer principally to carbon black, other optically dense substances, such as graphite, phthalocyanine pigments and other colored pigments can be used. If desired, substances which change their optical density upon subjection to temperatures as herein described can also be employed.

The binder for the image-forming substance or layer 14 provides a matrix to form the porous or particulate substance into a cohesive layer. This binder also serves to adhere layer 14 to heat-activatable zone or layer 12*c*. In general, it will be desired that image-forming layer 14 be adhered to surface zone or layer 12*c* sufficiently to prevent accidental dislocation either during the manufacture of medium 10 or during its use. Layer 14 should, however, be separable (in non-exposed regions) from zone or layer 12*c*, after imaging and separation of webs 12 and 22, so that partitioning of layer 14 can be accomplished in the manner shown in FIG. 2.

Image-forming layer 14 can be conveniently deposited onto surface zone or layer 12*c*, using known coating methods. According to one embodiment, and for ease in coating layer 14 onto zone or layer 12*c*, carbon black particles are initially suspended in an inert liquid vehicle, with a binder or dispersant, and the resulting suspension or dispersion is uniformly Spread over heat-activatable zone or layer 12*c*. On drying, layer 14 is adhered as a uniform image-forming layer on the surface zone or layer 12*c*. It will be appreciated that the spreading characteristics of the suspension can be improved by including a surfactant, such as ammonium perfluoroalkyl sulfonate, non-ionic ethoxylate or the like. Other substances, such as emulsifiers, can be used or added to improve the uniformity of distribution of the carbon black in either its suspended or its spread and dry state. Layer 14 can vary in thickness and typically will have a thickness of about 0.1 to about 10 μm. In general, it is preferred, for high image resolution, that a thin layer 14 be employed. Layer 14 should, however, be of sufficient thickness to provide desired and predetermined optical density in the images prepared from imaging medium 10.

Suitable binder materials for image-forming layer 14 include gelatin, poly(vinyl alcohol), hydroxyethyl cellulose, gum arabic, methyl cellulose, polyvinylpyrrolidone, polyethyloxazoline, polystyrene latex and poly(styrene-co-maleic anhydride). The ratio of pigment (e.g., carbon black) to binder can be in the range of from 40:1 to about 1:2 on a weight basis. Preferable, the ratio of pigment to binder will be from about 4:1 to about 10:1. A preferred binder material for a carbon black pigment material is poly(vinyl alcohol).

If desired, additional additives or agents can be incorporated into image-forming layer 14. Thus, submicroscopic particles, such as chitin, polytetrafluoroethylene particles and/or polyamide can be added to colorant/binder layer 14 to improve abrasion resistance. Such particles can be present, for example, in amounts of from about 1:2 to about 1:20, particles to layer solids, by weight.

Porous or particulate image-forming layer 14 can comprise a pigment or other colorant material such as carbon black which is absorptive of exposing radiation, and is known in the thermographic imaging field as a radiation-absorbing pigment. Since secure bonding or joining is desired at the interface between layer 14 and heat-activatable zone or layer 12*c*, it may sometimes be preferred that a radiation-absorbing substance be incorporated into either or both of image-forming layer 14 and heat-activatable zone or layer 12*c*.

Suitable radiation-absorbing substances in layers 14 and/or 12*c*, for converting radiation into heat, include carbon black, graphite or finely divided pigments such as the sulfides or oxides of silver, bismuth or nickel. Dyes such as the azo dyes, xanthene dyes, phthalocyanine dyes or anthraquinone dyes can also be employed for this purpose. Especially preferred are materials which absorb efficiently at the particular wavelength of the exposing radiation. Infrared dyes which absorb in the infrared-emitting regions of lasers which are desirably used for thermal imaging are especially preferred. Suitable examples of infrared-absorbing dyes for this purpose include the alkylpyrylium-squarylium dyes, disclosed in U.S. Pat. No. 4,508,811 (issued Apr. 2, 1985 to D. J. Gravesteijn, et al.), and including 1,3-bis[(2,6-di-t-butyl- 4H-thiopyran-4-ylidene)methyl]-2,4-dihydroxy-dihydroxide-cyclobutene diylium-bis{inner salt}. Other suitable infrared-absorbing dyes include those described in U.S. Pat. No. 5,231,190 (and in the corresponding European Application No. 92107574.3, Publication No. 516,985); in the corresponding International Application No. PCT/US91/08695, Publication No. WO 92/09661); in U.S. Pat. No. 5,227,498, and in U.S. Pat. No. 5,227,499 .

For the production of images of high resolution, it is essential that image-forming layer 14 comprise materials that permit fracture through the thickness of the layer and substantially orthogonal to the interface between surface zone or layer 12*c* and image-forming layer 14, i.e., substantially along the direction of arrows 24, 24', 26, and 26', shown in FIG. 2. It will be appreciated that, in order for images 10*a* and 10*b* to be partitioned in the manner shown in FIG. 2, image-forming forming layer 14 will be orthogonally fracturable as described above and will have a degree of cohesivity greater than its adhesivity for heat-activatable zone or layer 12*c*. Thus, on separation of webs 12 and 22 after imaging, layer 14 will separate in non-exposed areas from heat-activatable layer 12*c* and remain in exposed areas as porous or particulate portions 14*a* on web 12. Layer 14 is an imagewise disruptible layer owing to its porous or particulate nature and its capacity to fracture or break sharply at particle interfaces.

The release layer 16 shown in FIG. 1 is included in thermal imaging medium 10 to facilitate separation of images 10*a* and 10*b* according to the mode shown in FIG. 2. As described above, regions of medium 10 subjected to radiation become more firmly secured to heat-activatable zone or layer 12*c* because of the heat activation of the layer by the exposing radiation. Non-exposed regions of layer 14 remain only weakly adhered to heat-activatable zone or layer 12*c* and are carried along with sheet 22 on separation of sheets 12 and 22. This is accomplished by the adhesion of layer 14 to heat-activatable zone or layer 12*c*, in non-exposed regions, being less than: (a) the adhesion between layers 14 and 16; (b) the adhesion between layers 16 and 18; (c) the adhesion between layers 18 and 20; (d) the adhesion between layer 20 and sheet 22; and (e) the cohesivity of layers 14, 16, 18 and 20. The adhesion of sheet 22 to porous or particulate layer 14, through layers 16, 18 and 20, while sufficient to remove non-exposed regions of porous and particulate layer 14 from heat-activatable zone or layer 12*c*, is controlled, in exposed areas, by release layer 16 so as to prevent removal of firmly attached exposed portions 14*a* of layer 14 (attached to heat-activated zone or layer 12*c* after exposure).

Release layer 16 is designed such that its cohesivity and its adhesion to either first adhesive layer 18 or porous or particulate layer 14 is less, in exposed regions, than the adhesion of layer 14 to heat-activated zone or layer 12*c*. The result of these relationships is that release layer 16 undergoes an adhesive failure in exposed areas at the interface between layers 16 and 18, or at the interface between layers 14 and 16; or, as shown in FIG. 2, a cohesive failure of layer 16 occurs, such that portions (16*b*) are present in image 10*b* and portions (16*a*) are adhered in exposed regions to porous or particulate portions 14*a*. Portions 16*a* of release layer 16 serve to provide surface protection for the image areas of image 10*a* against abrasion and wear.

Release layer 16 can comprise a wax, wax-like or resinous material. Microcrystalline waxes, for example, high density polyethylene waxes available as aqueous dispersions, can be used for this purpose. Other suitable materials include Carnauba wax, beeswax, paraffin wax and wax-like materials such as poly(vinyl stearate), poly(ethylene sebacate), sucrose polyesters, polyalkylene oxides and dimethylglycol phthalate. Polymeric or resinous materials such as poly(methyl methacrylate) and copolymers of methyl methacrylate and monomers copolymerizable therewith can be employed. If desired, hydrophilic colloid materials, such as poly(vinyl alcohol), gelatin or hydroxyethyl cellulose can be included as polymer binding agents.

Resinous materials, typically coated as latices, can be used and latices of poly(methyl methacrylate) are especially useful. Cohesivity of layer 16 can be controlled to provide the desired and predetermined fracturing. Waxy or resinous layers which are disruptible and can be fractured sharply at interfaces between their particles can be added to the layer to reduce cohesivity. Examples of such particulate materials include silica, clay particles and particles of polytetrafluoroethylene.

The imaging medium 10 incorporates first and second adhesive layers 18 and 20, which are as described in U.S. Pat. No. 5,275,914; the entire disclosure of this patent incorporated by reference. The first adhesive layer 18 comprises a polymer having acidic groups thereon, preferably carboxyl groups. On contact with the second adhesive layer 20, first adhesive layer 18 serves to develop rapidly substantial pre-curing and post-curing adhesion to the second adhesive layer 20, thus securing the first and second elements together to form the unitary laminar imaging medium 10. A specific preferred copolymer for use in layer 18 is that available as Neocryl BT 520 from ICI Resins (U.S.), Wilmington, Mass. 01887-0677. This material is an acrylic copolymer containing sufficient free carboxyl groups to permit solubility in water that contains ammonia.

The second adhesive layer 20 of imaging medium 10 comprises a hardenable adhesive layer which protects the medium against stresses that would create a delamination of the medium, typically at the interface between zone or layer 12*c* and image-forming layer 14. The physical stresses which tend to promote delamination but can be alleviated by hardenable layer 20 can vary and include stresses created by bending the laminar medium and stresses created by winding, unwinding, cutting, slitting or stamping operations. Since hardenable layer 20 can vary in composition, it will be appreciated that a particular adhesive may, for example, provide protection of the medium against delamination promoted by bending of the medium, while providing little or no protection against delamination caused, for example, by a slitting or stamping-and-cutting operation, or vice versa.

Imaging medium 10 is normally prepared by the lamination of first and second sheet-like web elements or components, the first element or component comprising web material 12 carrying image-forming layer 14, release layer 16 and first adhesive layer 18, while the second element comprises second adhesive layer 20 and second web material 22. The two elements can be laminated under pressure, and optionally under heating conditions, to provide the unitary and laminar thermally actuatable imaging medium 10 of the invention.

Upon curing of second adhesive layer 20, medium material 10 is ready for imaging. Attachment of weakly adherent image-forming layer 14 to heat-activatable zone or layer 12*c* in areas of exposure is accomplished by (a) absorption of radiation within the imaging medium; (b) conversion of the radiation to heat sufficient in intensity to heat activate zone or layer 12*c*; and (c) cooling to more firmly join exposed regions or portions of layer 14 to heat-activatable zone or layer 12*c*. Thermal imaging medium 10 is capable of absorbing radiation at or near the interface of layer 14 with heat-activatable zone or layer 12*c*. This is accomplished by using layers in medium 10 which by their nature absorb radiation and generate the requisite heat for desired thermal imaging, or by including, in at least one layer, an agent which can absorb radiation of the wavelength of the exposing source. As already mentioned, infrared-absorbing dyes can be suitably employed for this purpose.

Thermal imaging medium 10 can be imaged by creating (in medium 10) a thermal pattern according to the information imaged. Exposure sources providing radiation which can be directed onto medium 10, and converted by absorption into thermal energy, can be used. Gas discharge lamps, xenon lamps and lasers are examples of such sources.

The exposure of medium 10 to radiation can be progressive or intermittent. For example, a medium as shown in FIG. 1 can be fastened onto a rotating drum for exposure of the medium through sheet 12. A radiation spot of high intensity, such as is emitted by a laser, can be used to expose the medium 10 in the direction of rotation of the drum, while the laser is moved slowly in a transverse direction across the web, thus tracing out a helical path. Laser drivers, designed to fire corresponding lasers, can be used to intermittently fire one or more lasers in an imagewise and predetermined manner to record information according to an original to be imaged. As shown in FIG. 2, a pattern of intense radiation can be directed onto medium 10 by exposure to a laser from the direction of the arrows 24, 24', 26 and 26', the areas between the respective pairs of arrows defining regions of exposure.

If desired, the imaging medium can be imaged using a moving slit or stencils or masks, and by using a tube, or other source, which emits radiation continuously and can be directed progressively or intermittently onto medium 10. Thermographic copying methods can also be used.

Preferably, a laser or combination of lasers is used to scan the medium and record information as very fine dots or pels. Semiconductor diode lasers and YAG lasers having power outputs sufficient to stay within upper and lower exposure threshold values of medium 10 will be preferred. Useful lasers may have power outputs in the range of from about 40 to about 1000 milliwatts. An exposure threshold value, as used herein, refers to a minimal power required to effect an exposure, while a maximum power output refers to a power level tolerable by the medium before "burn out" occurs. Lasers are particularly preferred as exposing sources since medium 10 may be regarded as a threshold-type of film; i.e., it possesses high contrast and, if exposed beyond a certain threshold value, will yield maximum density, whereas no density will be recorded below the threshold value. Especially preferred are lasers which can provide a beam sufficiently fine to provide images having resolution as fine as 4,000–10,000 dots per inch (160–400 dots per millimeter).

Locally applied heat, developed at or near the interface of image-forming layer 14 and heat-activatable zone or layer 12*c* can be intense (about 400° C.) and serves to effect imaging in the manner described above. Typically, the laser dwell time on each pixel will be less than one millisecond, and the temperature in exposed regions can be between about 100° C. and about 1000° C.

Apparatus and methodology for forming images from thermally actuatable media such as the medium 10 are described in detail in U.S. Pat. No. 5,170,261 (and the corresponding International Application No. PCT/US91/06880, Publication No. WO 92/10053); and in U.S. Pat. No. 5,221,971 (and the corresponding International Application No. PCT/US91/06892, Publication No. WO 92/10057).

The imagewise exposure of medium 10 to radiation creates in the medium latent images which can be viewed upon separation of the sheets 12 and 22 as shown in FIG. 2. Sheet 22 can comprise any of a variety of plastic materials transmissive of actinic radiation used for the photohardening of photohardenable adhesive layer 20. A transparent polyester (e.g., poly(ethylene terephthalate)) sheet material is preferred. In addition, sheet 22 will preferably be subcoated, or may be corona treated, to promote the adhesion thereto of photohardened layer 20. Preferably, each of sheets 12 and 22 will be flexible polymeric sheets.

The medium 10 is especially suited to the production of high density images as image 10*b*, shown in FIG. 2. As previously noted, separation of sheets 12 and 22 without exposure, i.e., in an unprinted state, provides a totally dense image in colorant material on sheet 22 (image 10*b*). The making of a copy entails the use of radiation to cause the image-forming colorant material to be firmly attached to web 12. Then, when sheets 12 and 22 are separated, the exposed regions will adhere to web 12 while unexposed regions will be carried to sheet 22 and provide the desired high density image 10*b*. Since the high density image provided on sheet 22 is the result of "writing" on sheet 12 with a laser to firmly anchor to sheet 12 (and prevent removal to sheet 22) those portions of the colorant material which are unwanted in image 10*b*, it will be seen that the amount of laser actuation required to produce a high density image can be kept to a minimum.

Since image 10*b*, because of its informational content, aesthetics or otherwise, will often be considered the principal image of the pair of images formed from medium 10, it may be desired that the thickness of sheet 22 be considerably greater,-and the sheet 22 thus more durable, than sheet 12. In addition, it will normally be beneficial from the standpoints of exposure and energy requirements that sheet 12, through which exposure is effected, be thinner than sheet 22. Asymmetry in sheet thickness may increase the tendency of the medium material to delaminate during manufacturing or handling operations. Utilization of photohardenable adhesive layer 20 will be preferred in medium 10 particularly to prevent delamination during manufacture of the medium. In the description of the protective process of the invention given below with reference to FIGS. 3–6, it will be assumed that it is the image 10*b* which is to be protected, but no significant changes in the procedure are required to use the same process for the protection of the image 10*a*.

Figure 3:
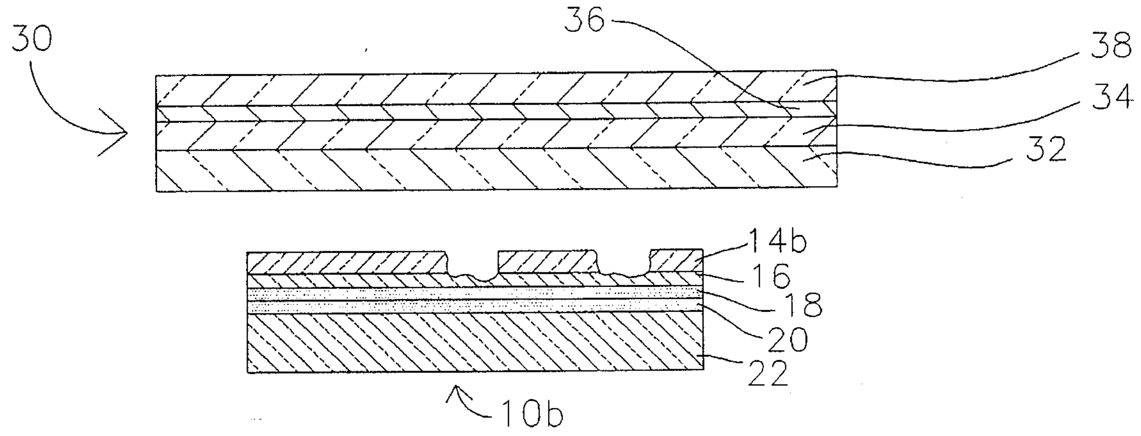
FIG. 3 shows a section through one of the binary images formed in FIG. 2 and a laminating sheet useful in the process of the present invention.

FIG. 3 of the accompanying drawings shows in section a laminating sheet (generally designated 30) disposed over the binary image 10*b* formed on sheet 22, as described above. The laminating sheet 30 comprises an adhesive layer 32, a durable layer 34, a release layer 36 and a support layer 38. The laminating sheet 30 is larger in both footprint dimensions (i.e., length and width) than the sheet 22.

Either or both of the adhesive layer 32 and the release layer 36 can be omitted from the laminating sheet in some cases. Some durable layers can function as their own adhesives without the need for a separate adhesive layer, and some durable layers will release cleanly from the support layer without the need for a separate release layer.

Figure 4:
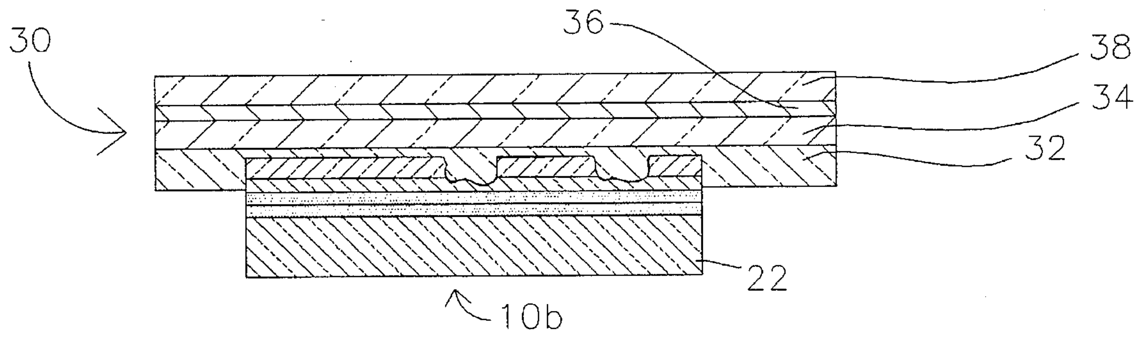
FIG. 4 shows in section the image and laminating sheet shown in FIG. 3 laminated together.
Figure 5:
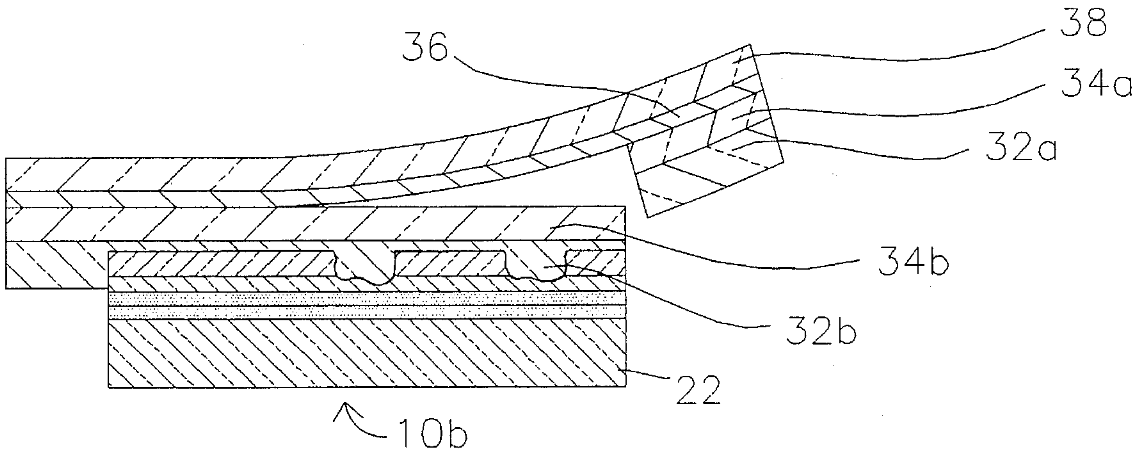
FIG. 5 shows in section the image and laminating sheet shown in FIGS. 3 and 4 as the support layer is being separated from the image.
Figure 6:
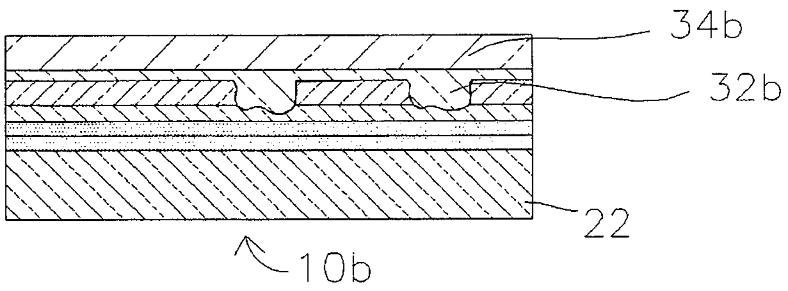
FIG. 6 shows in section the protected image produced after complete removal of the support layer.

As shown in FIG. 4, the laminating sheet 30 is laminated to the image 10*b* so that the adhesive layer 32 adheres to both the first and second areas of the image, and so that the laminating sheet 30 protrudes beyond the periphery of the sheet 22 all around the sheet. Next, the laminating sheet 30 is separated from the image 10*b*, as shown in FIG. 5; conveniently, one edge of the laminating sheet is gripped, manually by an operator or mechanically, and the laminating sheet 30 simply peeled away from the image 10*b*. As seen in FIG. 5, in peripheral portions of the laminating sheet where the adhesive layer 32 is not attached to the image 10*b*, the peripheral portions 32*a* and 34*a* of the adhesive layer 32 and the durable layer 34 respectively remain attached to the release layer 36 and the support layer 38, while the central portions 32*b* and 34*b* of the adhesive layer 32 and the durable layer 34 respectively remain attached to the image 10*b*, so that the adhesive layer 32 and the durable layer 34 break substantially along the periphery of the sheet 22, thus providing clean edges on the protected image 10*b*. Depending upon the nature of the release layer 36, none, part or all of the release layer 36 may remain with the central portions 32*b* and 34*b* of the adhesive layer 32 and the durable layer 34 on the image 10*b*. The central portions 32*b* and 34*b* of the adhesive layer 32 and the durable layer 34 respectively (with any release layer 36 remaining thereon) form a durable coating over the image 10*b*, as shown in FIG. 6.

Figure 7:
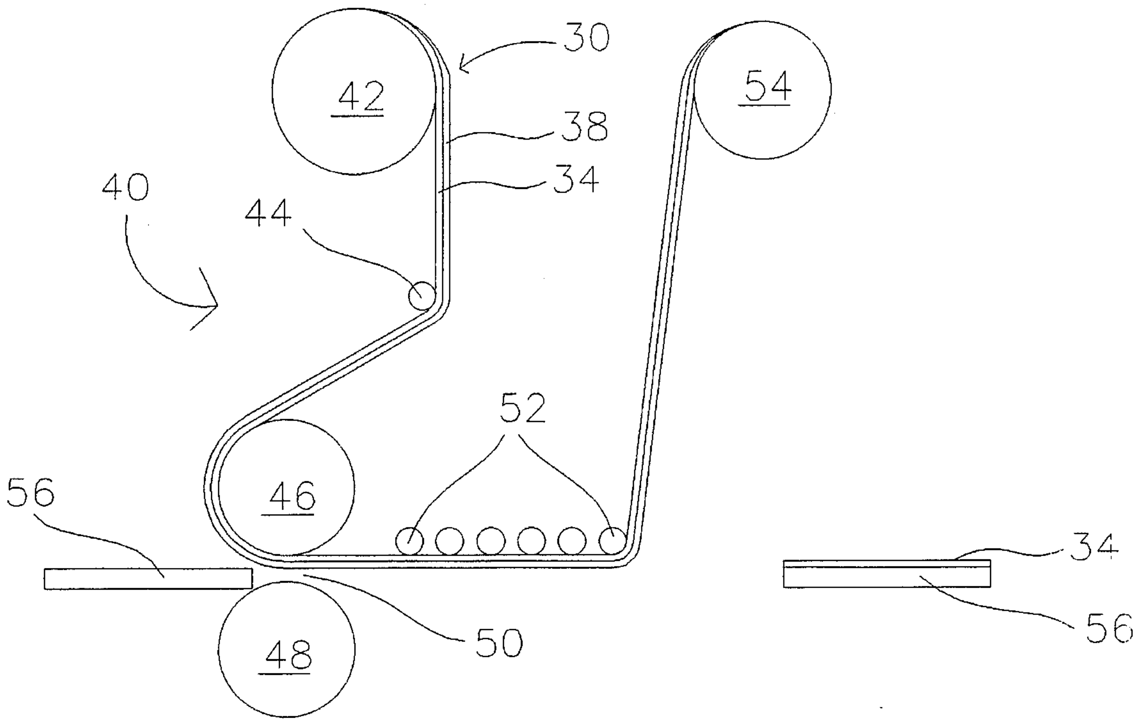
FIG. 7 shows a schematic side elevation of an apparatus useful for carrying out the process of the invention.

FIG. 7 shows an apparatus 40 which may be used to carry out the lamination process of FIGS. 3 to 6. This apparatus 40 comprises a feed roll 42 on which is wrapped a supply of laminating sheet 30 (which is shown for simplicity in FIG. 7 as comprising only the durable layer 34 and the support layer 38, although it may of course include other layers as described above), a first guide bar 44 and a pair of electrically heated rollers 46 and 48 having a nip 50 therebetween. The rollers 46 and 48 are provided with control means (not shown) for controlling the temperature of the rollers and the force with which they are driven toward one another, and thus the pressure exerted in the nip 50. The apparatus 40 further comprises a series of second guide bars 52 and a take-up roll 54.

Laminating sheet 30 is fed from the feed roll 42, around the guide bar 44 and into the nip 50 under a tension controllable by tension control means (not shown) provided on the feed roll 42 and/or the take-up roll 54. The image 56 to be protected is fed (manually or mechanically), image side up, into the nip 50 below the laminating sheet 30; the laminating sheet is made wider than the image so that excess laminating sheet extends beyond both side edges of the image 56. The heat and pressure within the nip 50 laminate the image 56 to the laminating sheet 30 and the two travel together beneath the guide bars 52, until the laminating sheet is bent sharply around the last of the guide bars 52. Because the thin laminating sheet 30 is more flexible than the image 56, this sharp bending of the laminating sheet causes, in the area where the laminating sheet 30 overlies the image 56, separation of the durable layer 34 from the support layer 38 with the durable layer 34 remaining attached to the image 56, whereas in areas where the laminating sheet 30 does not overlie the image 56, the durable layer 34 remains attached to the support layer 38. The support layer 38, and the areas of the durable layer 34 remaining attached thereto are wound onto the take-up roll 54.

The present invention provides protected differential adhesion images, which are resistant to abrasion and solvents, which are suitable for use in exposing second generation images, which can withstand repeated application and removal of graphic arts tape, and which are thus well suited for use in the graphic arts industry.

The following Examples are now given, though by way of illustration only, to show details of particularly preferred reagents, conditions and techniques used in the process of the present invention. All parts, ratios and proportions, except where otherwise indicated, are by weight.

EXAMPLE 1

Onto a first sheet of poly(ethylene terephthalate) of 1.75 mil (44 μm) thickness (ICI Type 3284 film, available from ICI Americas, Inc., Hopewell, Va.) were deposited the following layers in succession:

- a 2.4 μm thick stress-absorbing layer of polyurethane (a mixture of 90% ICI Neotac R-9619 and 10% ICI NeoRez R-9637, both from ICI Resins (U.S.), Wilmington, Mass.);
- a 1.3 μm thick heat-activatable layer of poly(styrene-co-acrylonitrile);
- a 1 μm thick layer of carbon black pigment, poly(vinyl alcohol) (PVA), 1,4-butanediol diglycidyl ether, and a fluorochemical surfactant (FC-171, available from Minnesota Mining and Manufacturing Corporation, St. Paul, Minn. 55144-1000) at ratios, respectively, of 5:1:0.18/0.005;
- a 0.6 μm thick release layer comprising polytetrafluoroethylene, silica and hydroxyethylcellulose (Natrosol +330, available from Aqualon Incorporated, Bath, Pa. 18014), at ratios, respectively, of 0.5:1:0.1; and
- a 2.2 μm thick layer of the aforementioned Neocryl BT 520 copolymer containing acidic groups.

To form the second adhesive layer, 5 parts of butyl acrylate, 82 parts of butyl methacrylate and 13 parts by weight of N,N-dimethylaminoethyl acrylate were copolymerized with AIBN to form a copolymer having a number average molecular weight of about 40,000 and a glass transition temperature of +11° C. A coating solution was prepared comprising 11.90 parts of this copolymer, 2.82 parts of trimethylol-propane triacrylate (TMPTA, available as Ageflex TMPTA from CPS Chemical Company, Old Bridge, N.J. 08857), 0.007 parts of 4-methoxyphenol (a free radical inhibitor), 1.14 parts of 2,2-dimethoxy-2-phenylacetophenone (a photoinitiator, available as Irgacure 651 from Ciba-Geigy Corporation), 0.037 parts of tetrakis{methylene(3,5-di-tert-butyl-4-hydroxyhydrocinnamate)}methane (an anti-oxidant, available as Irganox 1010 from Ciba-Geigy Corporation), 0.037 parts of thiodiethylene bis(3,5-di-tert-butyl-4-hydroxy)hydrocinnamate (an anti-oxidant, available as Irganox 1035 from Ciba-Geigy Corporation), and 58.28 parts of ethyl acetate solvent. This coating solution was coated onto 4 mil (101 μm) poly(ethylene terephthalate) film (ICI Type 526 anti-static treated film, available from ICI Americas, Inc., Hopewell, Va.; this film forms the second web 22 of the imaging medium 10) and dried in an oven at about 85° C. (185° F.) to a coating weight of about 9400 mg/m$^2$ to form a hardenable second adhesive layer 20 approximately 10 μm thick.

The first and second poly(ethylene terephthalate) sheets were immediately brought together with their adhesive layers in face-to-face contact, the 4 mil sheet being in contact with a rotating steel drum. A rubber roll having a Durometer hardness of 70–80 was pressed against the 1.75 mil sheet. The resulting web of laminar medium was then passed in line, approximately 30 seconds after lamination, under a radio-frequency-powered source of ultraviolet radiation, with the 4 mil sheet facing, and at a distance of about 2.5 inches (6.4 cm) from, the source (a Model DRS-111 Deco Ray Conveyorized Ultraviolet Curing System, sold by Fusion UV Curing Systems, 7600 Standish Place, Rockville, Md. 20855-2798), which served to cure the second adhesive layer 20.

After curing, the web of imaging medium was passed through a slitting station where edgewise trimming along both edges of the medium was performed in the machine direction. The resultant trimmed web was then wound onto a take-up roll.

Individual sheets of imaging medium cut from the resultant roll were imaged by laser exposure through the 1.75 mil sheet using high intensity semiconductor lasers. In each case, the medium was fixed (clamped) to a rotary drum with the 4 mil sheet facing the drum. Radiation from semiconductor lasers was directed imagewise through the 1.75 mil sheet in response to a digital representation of an original image to be recorded in the medium. After exposure to the high-intensity radiation (by scanning of the imaging medium orthogonally to the direction of drum rotation) and removal of the exposed imaging medium from the drum, the two sheets of the imaging medium were separated to provide a first image on the first, 1.75 mil sheet and a second (and complementary) image on the second, 4 mil sheet (the principal image).

A laminating sheet was prepared having as its support layer a sheet of 0.92 mil (23 μm) smooth poly(ethylene terephthalate). On to this support layer were coated successively:

- a release layer of polymeric wax;
- a 0.5 to 3 μm durable layer; and
- a 0.5 to 2 μm adhesive layer.

The fluid used for coating the durable layer comprised an organic polymer, a thermally activated polymerization initiator and a small proportion of an acrylated siloxane oligomer (63 g of siloxane per gallon of fluid, 16.7 g of siloxane per liter of fluid). This fluid was coated at from 8 to 15% solids solution, preferably 10% solids solution, to give a coverage of from about 0.5 to about 3 μm, preferably about 2 μm, dried coverage. Drying of the coating was effected in a 30 foot (9.1 m) oven with a web speed of 300 ft/min (91 m/min), the oven being maintained at approximately 250° F. (122° C.), with the web and coating reaching temperatures of about 220°–250° F. (103°–122° C.). Polymerization of the siloxane commenced during drying.

The fluid used for coating the adhesive layer comprised Morton X95-110. The laminating sheet was laminated on a laminator having a roller durometry of from about 55 to about 70 Shore A, a hot roller temperature of about 185° F. (85° C.), a piston air pressure of about 90 psig (0.74 MPa) and a speed setting of 5 feet/minute (1.52 m/min) to the black halftone image. After the lamination, the laminating sheet was peeled from the image, causing a failure to occur in the wax release layer and leaving a glossy surface of wax, durable layer and adhesive layer on the image.

The protected image thus produced was then subjected to the following tests:

Tape test

This test determines whether the durable coating adheres sufficiently to the image. A 4 inch (10 cm) piece of Red Lithographers tape #616 (produced by Minnesota Mining and Manufacturing Corporation) was smoothed manually on to the surface of the film bearing the durable layer. The tape was allowed to remain attached to the film for varying periods of time, up to several days. The tape was then manually ripped from the film, and the film inspected visually to determine whether any of the image or durable layer is removed with the tape. The durable layer produced as described above withstood repeated application and removal of the tape without visible damage to the image or the durable layer.

Tests for solvent resistance (a) Puddle test

The durable layer side of the film was exposed to various solvents, including water, isopropanol, and water-based and non-polar graphic arts solvents, for 5 minutes. The appearance of the film following the solvent treatment was observed and the tape test was then repeated. The durable layer produced as described above withstood the puddle test with water, isopropanol and hexane with no visible change in the protected image, and no noticeable effect on the performance of the protected image in the aforementioned tape test.

(b) Rub test

The same solvents as in (a) above were applied to wipes and rubbed 50 times over the durable layer side of the film. The appearance of the film following the solvent treatment was observed and the tape test was then repeated. The durable layer produced as described above withstood the rub test with water, isopropanol and hexane with no visible change in the protected image, and no noticeable effect on the performance of the protected image in the aforementioned tape test.

Scratch Resistance

An Erichsen Scar Resistance Tester, Model No. 425, was set to a test force of 10 Newtons, and the instrument was moved over the surface of the durable layer in a rapid motion. The spring force and number of strokes over a given point required to produce a surface scar visible to the naked eye were recorded. The test was repeated at several locations on the film, and then the tester was reset to a test force of 20 Newtons and the test again repeated at several locations. The durable layer produced as described above experienced no damage after 10 strokes at 10 Newtons or 5 strokes at 20 Newtons.

Opaquing Fluid Test

Using a standard opaquing fluid brush, a generous amount of each of various commercial opaquing fluids, of both the water and alcohol-based types, as used in the graphic arts industry, was applied to both sides of the film, allowed to dry thoroughly and exposed to 40 units of ultra-violet radiation. To pass this test, it was required that the film accept the fluid with no beading, and allow the fluid to dry to a smooth continuous coating, and that the opaque film adhere to the image-bearing film after exposure. The film bearing the durable layer produced as described above completed this test satisfactorily.

EXAMPLE 2

The following solutions were prepared in ethyl acetate and mixed:

| Conc., % | Component | Weight, g. | % of Total solids in mixture |
|---|---|---|---|
| 10 | Poly(methyl methacrylate), mol. wt. ~ 400,000 | 3.9948 | 94.8 |
| 10 | Hüls PS 802 siloxane oligomer | 0.2090 | 5.0 |
| 5 | AIBN | 0.0138 | 0.2 |

To approximately one-half of the above mixture were added 5 drops of a 2% solution of TMPTA. Both solutions (with and without the TMPTA) were coated using a #18 Meier coating rod onto a poly(ethylene terephthalate) web bearing a wax coating, to give a coating thickness after drying of approximately 2 μm. The resultant coatings were dried in an oven at 90° C. for 5 minutes, then overcoated with approximately 2 μm of Elvacite 2014 (a methyl methacrylate copolymer, glass transition temperature 40° C., sold by E. I. du Pont de Nemours & Co., Inc, Specialty Resins Division, Wilmington, Del. 19898); this overcoat acts as an adhesive layer for the sheet.

The laminating sheets thus produced could be used for protecting binary images using the same laminating technique as in Example 1 above.

EXAMPLE 3

The following solutions were prepared in ethyl acetate and mixed:

| Conc., % | Component | Weight, g. | % of Total solids in mixture |
|---|---|---|---|
| 10 | Poly(methyl methacrylate), mol. | 3.9888 | 95.0 |
| 10 | wt.~400,000 | | |
| 10 | Hüls PS 802 siloxane oligomer | 0.2012 | 4.8 |
| 2 | Irgacure 651 | 0.0451 | 0.2 |

To approximately one-half of the above mixture were added 5 drops of a 2% solution of TMPTA. Both solutions (with and without the TMPTA) were coated using a #18 Meier coating rod onto a poly(ethylene terephthalate) web bearing a wax coating, to give a coating thickness after drying of approximately 2 μm. The resultant coatings were cured by exposure to a Hanovia Mercury ultra-violet lamp for 2 minutes, then overcoated with approximately 2 μm of Elvacite 2014.

The laminating sheets thus produced could be used for protecting binary images using the same laminating technique as in Example 1 above.

EXAMPLE 4

This Example illustrates a process of the invention in which the durable layer is formed from a vinyl ether functionalized urethane, a vinyl ether functionalized aromatic ester, and a vinyl ether functionalized cyclohexane.

VEctomer 2010 vinyl ether functionalized urethane oligomer (15.44 g; supplied by Allied Signal Corporation, Morristown, N.J. 07962), VEctomer 4010 vinyl ether functionalized aromatic ester monomer (8.59 g; also supplied by Allied Signal Corporation) and Rapi-cure CHVE vinyl ether functionalized cyclohexane (7.80 g; supplied by GAF Corporation, Wayne, N.J. 07470) were mixed with mechanical stirring and gentle heating until a homogeneous mixture was obtained. To this mixture were added successively Ebecryl 350 (1.61 g; a siloxane acrylate, supplied by UCB Radcure, Smyrna, Ga. 30080), Cyracure UVI-6990 (0.38 g; a mixed triarylsulfonium hexafluorophosphate salt, supplied by Union Carbide Corporation, Danbury, Conn. 06817; this salt serves as a polymerization initiator) and 2,2-diethoxyacetophenone (0.38 g; supplied by Aldrich Chemical Company, Milwaukee, Wis. 53233; this material also serves as a polymerization initiator).

The resultant mixture was coated with a #6 Meier rod on to a wax paper carrier and exposed in air to the ultra-violet radiation from a Hanovia mercury lamp for less than one minute. Then, to provide an adhesive layer, a 10% solids solution of Elvacite 2014 in ethyl acetate was overcoated on the durable layer with a #20 Meier rod and dried.

The laminating sheet thus prepared was laminated to a binary image in the same way as in Example 1 above. The resultant protected image passed the Tape test described above, and the image was found to be highly durable.

EXAMPLE 5

This Example illustrates a process of the invention in which the durable layer is formed from a graft copolymer.

A mixture of water (80 g), styrene (18 g), a siloxane oligomer (2 g; Hüls PS 560 supplied by Hals America, Piscataway, N.J.; according to the manufacturer, this material is trimethylsiloxymethacryloxypropyl poly(dimethyl siloxane), an oligomer comprising dimethyl siloxane units bearing one methacrylate end group), AIBN (25 mg; a free radical polymerization initiator), sodium lauryl sulfate (1 g) and a siloxane-based surfactant (2 g; Hüls PS 071, supplied by Hüls America; according to the manufacturer this material is a polyalkylene oxide modified poly(dimethyl siloxane) oligomer) was sonified for 10 minutes to produce a uniform emulsion. This emulsion was then heated to 70° C. for 5.5 hours to effect polymerization.

The latex thus prepared was coated with a #16 rod on to C-subbed 1.5 mil (37 μm) poly(ethylene terephthalate) film (ICI 3175 film, sold by ICI Americas, Inc., Wilmington, Del.) and laminated on to a binary image in the same way as in Example 1 above.

The protected binary image thus prepared passed the tape test described above with tape application times of five minutes, one hour, four hours, 24 hours and three days. The protected image was also subjected to the following test:

Critical load test

A diamond stylus was run across the surface of the protected image as the load on the arm is increased by a testing apparatus. The critical load is defined as the load at which a decrease in the density of the image is observed; this decrease in density is caused by marring of the protective layer. Removal of the overcoat is not observed until a load substantially greater than the critical load is applied.

The protected image produced in this Example had a critical load of 90–100 grams in the above test.

EXAMPLE 6

This Example illustrates a process of the invention in which the durable layer is formed from a graft copolymer.

A mixture of water (80 g), methyl methacrylate (16 g), a siloxane oligomer (2 g; Hüls PS 560), AIBN (25 mg), sodium lauryl sulfate (1 g) and a siloxane-based surfactant (2 g; Hüls PS 556, supplied by Hüls America; according to the manufacturer this material is a carbinol-terminated poly(dimethyl siloxane) oligomer) was sonified for 10 minutes to produce a uniform emulsion. This emulsion was then heated to 80° C. for one hour and then to 70° C. for a further 16 hours to effect polymerization. Nuclear magnetic resonance analysis indicated 33.6 mole % of siloxane repeating units in the polymer. Characterization of the polymer indicated that the particle phase was cross-linked.

The latex thus prepared was coated with a #16 rod on to C-subbed 1.5 mil (37 μm) poly(ethylene terephthalate) film (ICI 3175 film) and laminated on to a binary image in the same way as in Example 1 above.

The protected image thus prepared passed the tape test with the same tape application times as in Example 5 above, and recorded a critical load of 50–60 grams in the critical load test.

We claim:

1. A process for protecting a binary image, this binary image comprising a plurality of first areas, at which a porous or particulate image-forming substance is adhered to a substrate, and a plurality of second areas, at which the substrate is free from the image-forming substance, which process comprises:

providing a laminating sheet comprising a durable layer and a support layer, the durable layer being substantially transparent and comprising a polymeric organic material having incorporated therein a siloxane, the siloxane being incorporated into the polymeric material in such a manner that it is not removed therefrom by hexane, isopropanol or water;

laminating the laminating sheet to the binary image so that the durable layer adheres to both the first and second areas of the image; and separating the support layer from the image such that the durable layer remains attached to the image, thereby covering the image with a durable layer such that exposure of the durable layer to hexane, isopropanol or water does not remove the siloxane from the durable layer.

2. A process according to claim 1 wherein the laminating sheet further comprises a release layer interposed between the durable layer and the support layer and wherein, in the areas where the durable layer remains attached to the image, separation of the durable layer from the support layer occurs by failure within or on one surface of the release layer.

3. A process according to claim 1 wherein the laminating sheet further comprises an adhesive layer disposed on the surface of the durable layer remote from the support layer, whereby, during the lamination, the durable layer is adhered to the image by the adhesive layer.

4. A process according to claim 3 wherein the adhesive layer comprises a hot melt adhesive and during the lamination the adhesive is heated to cause it to adhere to the image.

5. A process according to claim 4 wherein the hot melt adhesive comprises an ethylene/vinyl acetate copolymer.

6. A process according to claim 1 wherein the organic material in the durable layer is derived from a monomer which forms a durable homopolymer.

7. A process according to claim 6 wherein the organic material in the durable layer comprises poly(methyl methacrylate).

8. A process according to claim 1 wherein the durable layer comprises not more than about 10 per cent by weight of siloxane.

9. A process according to claim 1 wherein the durable layer is formed by:

providing a mixture of an organic polymer, a polymerizable monomer or oligomer of a siloxane, and a polymerization initiator;

spreading a layer of the mixture upon the support layer; and subjecting the layer of the mixture to conditions effective to activate the polymerization initiator and thereby cause polymerization of the siloxane monomer or oligomer, and formation of the polymeric organic material.

10. A process according to claim 9 wherein the siloxane has a functionality of at least about two.

11. A process according to claim 9 wherein the siloxane comprises an acrylate or methacrylate group.

12. A process according to claim 11 wherein the siloxane is at least one of dimethyl siloxane, (acryloxypropyl)methyl siloxane and a silicone hexaacrylate.

13. A process according to claim 9 wherein the mixture further comprises a cross-linking agent.

14. A process according to claim 1 wherein the polymeric organic material comprises a graft copolymer of a siloxane and an organic monomer.

15. A process according to claim 1 wherein the polymeric organic material has been prepared by polymerizing a siloxane with a vinyl ether functionalized monomer or oligomer 16. A process according to claim 1 wherein the laminating sheet is laminated to the binary image such that at least one portion of the laminating sheet extends beyond the periphery of the substrate, and wherein the support layer is separated from the image such that, in said at least one portion of the laminating sheet, the durable layer remains attached to the support layer so that the durable layer breaks substantially along the periphery of the substrate.

17. A process according to claim 1 wherein the durable layer on the image:

a) has an abrasion resistance of at least 10 cycles of a 10 Newton force as measured by an Erichsen Scar Resistance Tester; and b) is not removed from the image by contact with adhesive tape having an adhesion to steel of 33 grams per millimeter, as measured by ASTM D-3330.

18. A process according to claim 1 wherein the durable layer formed on the image has a thickness not greater than about 30 μm.

19. A process according to claim 18 wherein said durable layer formed on the image has a thickness not greater than about 12 μm.

20. A process according to claim 19 wherein said durable layer formed on the image has a thickness in the range of from about 0.5 to about 10 μm.

21. A process for forming a protected image, the process comprising:

providing a layer of a porous or particulate image-forming substance on a heat-activatable image-forming surface of a substrate, the layer of the image-forming substance having a cohesive strength greater than the adhesive strength between the layer and the substrate, thereby providing a thermal imaging medium, said thermal imaging medium being capable of absorbing radiation at or near the interface of said heat-activatable image-forming surface with said layer of porous or particulate image-forming substance, converting the absorbed radiation into heat sufficient in intensity to activate said heat-activatable image-forming surface, such that upon cooling exposed portions of said layer of porous or particulate image-forming substance are more firmly attached to said heat-activatable image-forming surface;

imagewise subjecting portions of the thermal imaging medium to exposure to brief and intense radiation, thereby causing absorption of said radiation at or near the interface of said heat-activatable image-forming surface with said layer of porous or particulate image-forming substance, conversion of the absorbed radiation into heat, activation of said heat-activatable image-forming surface, and firm attachment of exposed portions of the image-forming substance to the substrate;

removing from the substrate those portions of the image-forming substance not exposed to the radiation, thereby forming a binary image comprising a plurality of first areas, at which the image-forming substance is adhered to a substrate, and a plurality of second areas, at which the substrate is free from the image-forming substance;

providing a laminating sheet comprising a durable layer and a support layer, the durable layer being substantially transparent and comprising a polymeric organic material having incorporated therein a siloxane, the siloxane being incorporated into the polymeric material in such a manner that it is not removed therefrom by hexane, isopropanol or water;

laminating the laminating sheet to the binary image so that the durable layer adheres to both the first and second areas of the image; and separating the support layer from the image such that the durable layer remains attached to the image, thereby covering the image with a durable layer such that exposure of the durable layer to hexane, isopropanol or water does not remove the siloxane from the durable layer.

22. A process for forming a protected image, the process comprising:

providing a layer of a porous or particulate image-forming substance on a heat-activatable image-forming surface of a first sheet-like element, the layer of the image-forming substance having a cohesive strength greater than the adhesive strength between the layer and the first element;

providing a second sheet-like element on the opposed side of the layer of image-forming substance from the first element, the image-forming substance having an adhesion to the second element greater than its adhesion to the first element, thereby providing a thermal imaging medium, said thermal imaging medium being capable of absorbing radiation at or near the interface of said heat-activatable image-forming surface with said layer of porous or particulate image-forming substance, converting the absorbed radiation into heat sufficient in intensity to activate said heat-activatable image-forming surface, such that upon cooling exposed portions of said layer of porous or particulate image-forming substance are more firmly attached to said heat-activatable image-forming surface and to said first sheet;

imagewise subjecting portions of the thermal imaging medium to exposure to brief and intense radiation, thereby causing absorption of said radiation at or near the interface of said heat-activatable image-forming surface with said layer of porous or particulate image-forming substance, conversion of the absorbed radiation into heat, activation of said heat-activatable image-forming surface, and firm attachment of exposed portions of the image-forming substance to the first element;

separating the first and second elements, thereby leaving those portions of the image-forming substance not exposed to the radiation attached to the second element and those portions of the image-forming substance exposed to the radiation attached to the first element, and thereby forming a pair of images on the first and second elements, each of the images comprising a plurality of first areas, at which the image-forming substance is adhered to the first or second dement, and a plurality of second areas, at which the first or second element is free from the image-forming substance;

providing a laminating sheet comprising a durable layer and a support layer, the durable layer being substantially transparent and comprising a polymeric organic material having incorporated therein a siloxane, the siloxane being incorporated into the polymeric material in such a manner that it is not removed therefrom by hexane, isopropanol or water;

laminating the laminating sheet to the binary image so that the durable layer adheres to both the first and second areas of the image; and separating the support layer from the image such that the durable layer remains attached to the image, thereby covering the image with a durable layer such that exposure of the durable layer to hexane, isopropanol or water does not remove the siloxane from the durable layer.

* * * * *